(12) United States Patent
Pfeiffer-Wagner

(10) Patent No.: US 10,673,193 B2
(45) Date of Patent: *Jun. 2, 2020

(54) TAPPING APPARATUS FOR TRANSMITTING ELECTRICAL ENERGY

(71) Applicant: PSZ electronic GmbH, Vohenstrauß (DE)

(72) Inventor: Klaus Pfeiffer-Wagner, Weiden (DE)

( * ) Notice: Subject to any disclaimer, the term of this patent is extended or adjusted under 35 U.S.C. 154(b) by 0 days.

This patent is subject to a terminal disclaimer.

(21) Appl. No.: 16/391,533

(22) Filed: Apr. 23, 2019

(65) Prior Publication Data

US 2019/0260173 A1   Aug. 22, 2019

Related U.S. Application Data

(62) Division of application No. 15/921,739, filed on Mar. 15, 2018, now Pat. No. 10,396,517.

(30) Foreign Application Priority Data

Feb. 19, 2018 (DE) .......................... 10 2018 103 669

(51) Int. Cl.
*H01R 41/00* (2006.01)
*H01R 25/14* (2006.01)
(Continued)

(52) U.S. Cl.
CPC ........... *H01R 41/00* (2013.01); *H01R 25/142* (2013.01); *H02B 1/48* (2013.01); *H05K 5/0069* (2013.01);
(Continued)

(58) Field of Classification Search
CPC .... H01R 25/16; H01R 25/161; H01R 25/162; H01R 25/164; H01R 41/00; H01R 25/142; H05K 5/0069
See application file for complete search history.

(56) References Cited

U.S. PATENT DOCUMENTS

| 6,215,263 | B1 * | 4/2001 | Berkowitz | ............. H01H 33/36 307/139 |
| 9,929,522 | B2 * | 3/2018 | Pfeiffer-Wagner | .......................... H01R 25/142 |
| 2015/0257286 | A1 * | 9/2015 | Sichmann | ............ H01R 4/4809 361/732 |

FOREIGN PATENT DOCUMENTS

DE      4 446 601 A1   6/1996
DE   10 2016 000 05 A1   7/2017
(Continued)

OTHER PUBLICATIONS

German Examination Report, for German Patent Application 10 2018 103 669.8, dated Dec. 11, 2018.
(Continued)

*Primary Examiner* — Edwin A. Leon
*Assistant Examiner* — Milagros Jeancharles
(74) *Attorney, Agent, or Firm* — Michael J. Gallagher, Esq.; Luper Neidenthal & Logan, LPA

(57) ABSTRACT

The invention relates to a tapping apparatus for transmitting electrical energy from a, preferably spatially fixed, busbar to a tapping device which can be moved along the busbar or is also spatially fixed, comprising at least one connection housing, the busbar being mechanically connected or connectable to the tapping device by means of the connection housing, and a current tapping apparatus which comprises sliding contact elements for collecting electrical energy from the busbar, the current tapping apparatus being mechanically rigidly connected to the connection housing, and furthermore the connection housing comprising at least one base support, on which at least two control circuit boards are mounted, or said two control circuit boards themselves forming the base support.

10 Claims, 9 Drawing Sheets

(51) Int. Cl.
*H05K 5/00* (2006.01)
*H02B 1/48* (2006.01)
*H02B 1/42* (2006.01)
*H02G 5/08* (2006.01)
*H02G 3/10* (2006.01)
*H02B 1/20* (2006.01)

(52) U.S. Cl.
CPC ............... *H02B 1/20* (2013.01); *H02B 1/42* (2013.01); *H02G 3/105* (2013.01); *H02G 5/08* (2013.01)

(56) References Cited

FOREIGN PATENT DOCUMENTS

| | | | |
|---|---|---|---|
| EP | 321 871 A2 | 12/1988 |
| EP | 828 323 A2 | 8/1997 |
| EP | 1 209 788 A1 | 11/2001 |
| WO | WO 1 992 004 813 A1 | 3/1992 |

OTHER PUBLICATIONS

European Search Report, for European Patent Application 18173819.6-1201, dated Dec. 18, 2018.

* cited by examiner

TAPPING APPARATUS FOR TRANSMITTING ELECTRICAL ENERGY

CROSS-REFERENCE TO RELATED APPLICATIONS

This application claims priority to German Patent Application 102018103669.8, filed Feb. 19, 2018; which is incorporated as if fully rewritten herein. This is a Divisional United States Utility Patent Application divided from U.S. Utility patent application Ser. No. 15/921,739; filed Mar. 15, 2018; which is incorporated as if fully rewritten herein.

STATEMENT REGARDING FEDERALLY SPONSORED RESEARCH OF DEVELOPMENT

N/A

NAMES OF THE PARTIES TO A JOINT RESEARCH AGREEMENT

N/A

INCORPORATION BY REFERENCE OF MATERIAL SUBMITTED ON A COMPACT DISC OR AS A TEXT FILE VIA THE OFFICE ELECTRONIC FILING SYSTEM (EFS-WEB)

N/A

STATEMENT REGARDING PRIOR DISCLOSURES BY THE INVENTOR OR A JOINT INVENTOR

N/A

BACKGROUND OF THE INVENTION

Field of the Invention

The present invention relates to a tapping apparatus for transmitting electrical energy from a busbar to a tapping device which can be moved along the busbar or which also may be spatially fixed.

Description of Related Art Including Information Disclosed Under 37 CFR 1.97 and 1.98

N/A

BRIEF SUMMARY OF THE INVENTION

The busbar may be in particular an arrangement of a plurality of elongate electrical conductors which are laid in parallel with one another and are mounted either individually or together in additional insulation elements, e.g. plastics bodies, for example. The busbar may also be fixedly mounted in a manufacturing room, for example on the floor thereof, without the busbar moving relative to the floor during operation.

For example, the individual electrical conductors may be guided in the shape of a rail, preferably also along a rail or in the form of a rail guide.

In order to constantly, i.e. permanently, supply a manufacturing robot with electrical energy, for example, it is therefore often necessary to install a tapping apparatus between the above-mentioned busbar and a manufacturing robot of this kind to be electrically powered or another electrically powered element.

For example, the tapping apparatus can be moved in the main extension direction of the busbar, preferably together with a robot of this kind, though while being in constant electrical contact with the busbar when said apparatus is moving.

Alternatively, the two components may also be spatially fixed.

In other words, the tapping apparatus therefore makes it possible to reliably supply the robot or the other electrical element with electrical energy, irrespective of the position of the robot in relation to the busbar, provided that the tapping apparatus is reliably electrically contacting the busbar.

However, this requires an apparatus which establishes an electrically conductive contact between the busbar and the tapping apparatus. The tapping apparatus according to the invention, proposed at the outset, is used for this purpose.

The above tapping apparatus for transmitting electrical energy from a, preferably spatially fixed, busbar to a tapping apparatus which can be moved along the busbar or is also spatially fixed, comprises at least one connection housing, the busbar being mechanically connected or connectable to the tapping apparatus by means of the connection housing, and comprises a current tapping apparatus which comprises a sliding contact elements for collecting electrical energy from the busbar, the current tapping apparatus being mechanically rigidly connected to the connection housing.

According to the invention, the connection housing comprises at least one base support, on which at least two control circuit boards are mounted, or said two control circuit boards themselves form the base support.

The base support may be in the form of a base sheet and consist of an electrically insulating material on which electrical lines are laid. Plastics or ceramics material may be used for this purpose.

The connection apparatus also comprises a current tapping apparatus, which in turn comprises at least one sliding contact element for collecting electrical energy from the busbar. The sliding contact elements extend through the base support and comprise, on a side of the base support facing away from the busbar, a contacting region by means of which at least one circuit board of the connection apparatus and/or at least one circuit board of the tapping apparatus can be electrically conductively contacted.

For example, the sliding contact elements are in the form of sliding push-on elements, and therefore the connection housing can be pushed onto the busbar without using tools.

Within the meaning of the invention, a sliding push-on element may be an element which can be arranged on a line of the busbar from one direction, a plug-in connection between the busbar, or even on one of the lines themselves, and the connection housing being established during the positioning process. The plug-in connection may be in the form of a plug-and-place connection.

The plug-in connection may be in the form of a clip connection. A clip connection of this kind may comprise a snap-fit element (the clip) that encloses the periphery of a line of the busbar once said element has snapped into place.

BRIEF DESCRIPTION OF THE SEVERAL VIEW OF THE DRAWINGS

Further advantages and embodiments can be found in the accompanying drawings, in which.

Figure 1A:
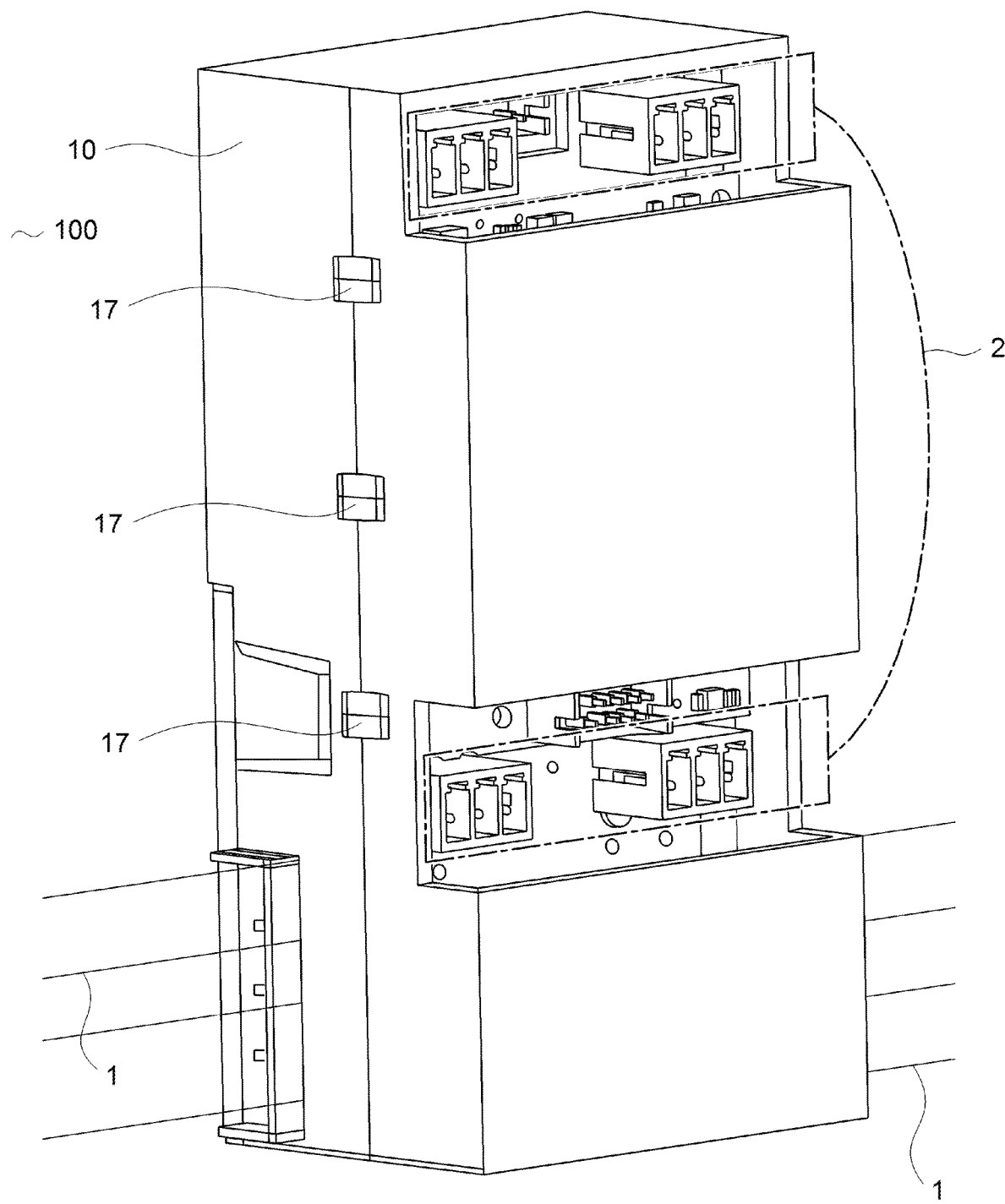
FIG. 1A to 1D are various perspective views of an embodiment of the tapping apparatus 100 described herein.

These illustrations are provided to assist in the understanding of the exemplary embodiments of the method of forming a moldable splint and materials related thereto described in more detail below and should not be construed as unduly limiting the specification. In particular, the relative spacing, positioning, sizing and dimensions of the various elements illustrated in the drawings may not be drawn to scale and may have been exaggerated, reduced or otherwise modified for the purpose of improved clarity. Those of ordinary skill in the art will also appreciate that a range of alternative configurations have been omitted simply to improve the clarity and reduce the number of drawings.

DETAILED DESCRIPTION OF THE INVENTION

According to at least one embodiment, the mechanical connection between the connection housing is established, in particular only, by pushing (clipping) the sliding contact connection, in particular the clip connection, onto each of the lines.

The connection between the connection housing and the busbar is, for example, free of any additional fastening elements, such screws, bolts or clamping elements.

Alternatively or additionally, the tapping apparatus described herein comprises a combi clip, the combi clip being mechanically detachably engaged with a part of outer periphery of the connection housing in order to establish a mechanical connection between the connection housing and a connection support. For example, the connector support supports and guides the busbar in a mechanically stable manner.

Components, preferably all remaining components, of the tapping apparatus are there movably or non-movably mounted on the connection housing. For example, when a robot of this kind is moving, the entire contacting apparatus, including the connection support, moves in the main extension direction of the busbar together with the robot.

According to at least one embodiment, the combi clip is mechanically detachably engaged with a part of the outer periphery of the connection housing, and a mechanical connection between the connection housing and a connection support is thus established such that a cavity, which is open on both sides in the direction of travel of the connection housing and through which the busbar is guided, is formed between a wall of the combi clip and the current tapping apparatus.

The direction of travel extends preferably in parallel with a main extension direction of the busbar.

The combi clip is preferably formed of an electrically insulating material, for example a plastics material. In this connection, it is conceivable for the material of the combi clip to be a single-component or multiple-component plastics material that is produced, for example, by means of an injection moulding method. Alternatively, the combi clip may also be formed of a ceramics material either completely or in part. Although ceramics materials are relatively expensive to purchase, they also have higher thermal insulation.

Alternatively or additionally, the entire combi clip, or parts thereof, may also be produced by means of 30 printing method. This has incidentally been found to be advantageous as a wide range of requirements must be placed on the combi clip, for example with regard to its size, thickness and dimensioning, in the field of contacting apparatuses for transmitting electrical energy. Indeed, the combi clip preferably also defines a distance between the connection housing and the busbar in at least one direction.

It is also conceivable for the combi clip to be formed having metal or inorganic parts in the micrometre or nanometre range in addition to the above-mentioned electrically insulating material, either at least in part or completely. This is because it has been found that nanoparticles of this kind also give the combi clip greater strength, inter alia. Indeed, the combi clips preferably the only mechanical connection between the connection housing and the connection support.

As shown non-exhaustively below, the following 3D printing technologies may be used to produce the connection housing and/or the combi clip:

1. The FDM Method (Fused Deposition Modelling)

Alternative names: Fused Filament Fabrication (FFF), Fused Layer Modelling (FLM)

The method describes applying (extruding) a material layer by layer through a hot nozzle. The consumable is in the form of a long wire (referred to as a filament) on a reel and is pushed through the feed unit into a printing head where it is melted and applied to a printing bed. The printing head and/or printing bed can be moved in three directions. Plastics layers can thus be gradually applied one on top of the other.

2. The SLS Method (Selective Laser Sintering)

In contrast with the sintering method, in which powdered substances are fused together by applying heat, in the SLS method this takes place selectively by means of a laser (alternatively also an electron beam or infrared beam).Only a certain portion of the powder is thus fused together.

For this purpose, a thin powder layer is constantly dispensed from the coating unit onto the printing bed. The laser (or other energy source) is then directed at individual positions on the powder layer in a pinpoint manner in order to form the first layer of the printing data. In the process, the powder is fused or surface-fused and then re-solidifies by means of mild cooling. The non-fused powder remains around the sintered regions and is used as a supporting material. Once a layer has solidified, the printing bed sinks by a fraction of a millimetre. The coating unit then travels over the printing bed and applies the next powder layer. The second layer of the printing data is then sintered by the laser (or another energy source). A three-dimensional object is thus formed layer by layer.

3. Three-Dimensional Printing (3DP)

The 3DP method works in a very a similar manner to selective laser sintering, although instead of a directed energy source, a printing head travels over the powder. Said printing head deposits tiny droplets of binder onto the underlying powder layers, which are thus fused together. This method is otherwise identical to the SLS method.

4. Stereolithography (SLA)

Instead of a plastics wire or powdered printing material, liquid resins, or what are referred to as photopolymers, are used in the stereolithography method. They are hardened layer by layer by means of UV radiation and thus produce three-dimensional objects. For this purpose, the construction platform is gradually lowered in the resin tank. There are also variants (what are referred to as polyjet methods) without the need for a tank containing liquid resin. For this purpose, an epoxy resin is applied drop by drop from a nozzle and immediately hardened by means of a UV laser.

5. Laminated Object Manufacturing (LOM)

Alternative name: Layer Laminated Manufacturing (LLM)

The method is based on neither chemical reactions, nor a thermal process. By means of a separating tool (e.g. a knife or carbon dioxide laser), a film or sheet (e.g. paper) is cut on the contour and one layer is adhesively bonded to the other. A layered object made of adhesively bonded films lying one on top of the other is thus formed by lowering the construction platform.

According to at least one embodiment, the tapping apparatus described herein comprises at least one power plug housing, the power plug housing being mechanically attached to the busbar and/or the tapping device from the outside such that a mechanical connection between the connection housing and the busbar is established by means of the power plug housing. For example, an electrical connection between the connection housing and the busbar and/or the connection housing may also be established by the power plug housing in addition to the mechanical connection.

It is conceivable for the power plug housing to be designed as a line-end element that mechanically rigidly, though preferably detachably, connects the tapping device and its electrical conductors, at one of their ends, to the connection housing. In addition, the power plug housing may be detachably or non-detachably mechanically fixed to a mounting surface of the connection housing. Following the fixing process, one end of the busbar is therefore mechanically, and for example also electrically conductively, connected to the busbar by means of the connection housing. The mounting surface is therefore preferably part of the outer surface of the connection housing. For example, a main extension plane of the mounting surface extends in parallel with the main extension direction and/or main extension plane of the busbar.

For example, the above-described tapping apparatus may comprise two "connection apparatuses", one connection apparatus, the above-described combi clip, being used to connect the connection support to the connection housing, and another connection apparatus, the above-described power plug housing, being used to connect the tapping device to the connection housing. However, the tapping device may also be identical to the power plug housing and the elements installed therein. However, it is also possible for the tapping apparatus to be an additional connection component that is electrically conductively mounted on the power plug housing. Said connection component may be a manufacturing robot or part thereof.

In at least one embodiment, the combi clip described herein, i.e. the connection element described herein, between the connection housing and the busbar is produced at least substantially by means of a snap-fit process of the combi clip into regions of the connection housing and/or the connection support intended therefor, instead of by means of screw apparatuses and/or external retaining and gripping apparatuses.

In this respect, the combi clip described herein makes it possible to establish a particularly individual, exchangeable and quick connection between the connection housing and the busbar. It is thus no longer necessary to make complex modifications and also to carry out complex fastening work for fastening the busbar to the connection housing, or vice versa. This therefore allows not only a particularly simple mounting process, but also a considerable cost saving and a wide variety in the serial production of the individual elements and their fields of application.

According to at least one embodiment, the tapping apparatus for transmitting electrical energy from a, preferably spatially fixed, busbar to a tapping device which can be moved along the busbar or is also spatially fixed, comprises at least one connect on housing, the busbar being mechanically connected or connectable to the tapping apparatus by means of the connection housing, there being a current tapping apparatus which comprises sliding contact elements for collecting electrical energy from the busbar, the current tapping apparatus being mechanically rigidly connected to the connection housing, the connection housing comprising at least one base support, on which at least two control circuit boards are mounted, or said two control circuit boards themselves forming the base support.

The tapping apparatus and the tapping device may be distinct from one another.

According to at least one embodiment, the mechanical connection between the connection housing and the connection support is established merely by clipping the combi clip onto the part of the outer periphery of the connection housing. The connection between the combi clip and the connection support is also preferably established merely by clipping the combi clip on.

At least one of the connections (between, firstly, the combi clip and the connection housing and, secondly, the combi clip together with the connection support) is therefore free of any kind of fastening elements other than the combi clip, such as screws, bolts or clamping elements.

In other words, in an embodiment of this kind the combi clip itself forms its own retaining and fixing means.

According to at least one embodiment, the combi clip comprises at least one upper clip element on an upper side in order to be clipped onto the connection housing, the upper clip element being designed such that said element, by itself, is attached to the outer periphery of the connection housing by compressive force being applied towards the connection housing and/or a free end of the upper clip element is connected to a fastening region of the connection housing that is intended for and uniquely associated with said end.

For example, the upper clip element projects away from a horizontal mounting plane of the combi clip in at least one directional component. The mounting plane of the combi clip may be formed entirely or at least in part by a, for example flat, sheet of material. The mounting plane of the clip element is, for example, in parallel with the mounting plane of the connection housing, on which the power plug housing is arranged.

For example, the upper clip element is formed on an edge of the mounting surface of the combi clip. In addition, it is conceivable for the upper clip element to also end completely flush with the mounting surface of the combi clip at the edge thereof. Specifically, this ensures that the upper clip element therefore attaches itself to the outer surface from the outside purely by pressure being applied (pressure of the connection housing towards the combi clip) preferably without using additional tools and, for example, snaps into place.

However, in addition to an upper clip element of this kind arranged at the edge, the combi clip described herein may also comprise at least one, though preferably also a plurality of, further upper clip elements along the mounting surface of said combi clip, which clip elements are arranged on the mounting surface so as to be remote from the edge of the mounting surface and to project away therefrom.

According to at least one embodiment, the combi clip comprises at least one lower clip element, on a lower side which is opposite the upper side, in order to be fastened in an opening of the connection support, the lower clip element being designed such that said element, by itself, engages with an edge of the opening in the connection support by compressive force being applied to the combi clip towards the connection support.

In at least one embodiment, the connection support therefore comprises at least one opening or depression, in the interior of which at least one upper clip element of the combi clip can snap into place. Said clip movement, and thus snap-fit movement, of the lower clip element is designed in the same way as the above-described upper clip element, only with the difference that the upper clip element and the lower clip element each project away from the mounting surface of the combi clip in different directions and are arranged on different sides of the mounting surface.

According to at least one embodiment, the lower clip element hooks to the opening in the connection support.

In this respect, it is conceivable for the lower clip element to be in the form of a hook in the same way as the upper clip element, for example. This means that a hook of this kind comprises a hooking element at least at the end thereof. Indeed, it has been shown that a hooking action of this kind allows particularly simple and automatic hooking without using tools.

According to at least one embodiment, the power plug housing is open on one side at least in part, the power plug housing comprising at least one power plug clip element on said side, and the power plug clip element being designed such that said element, by itself, is attached to the outer periphery of the connection element by compressive force being applied towards the connection housing and/or a free end of the power plug clip element is connected to a further fastening region, also of the connection housing, that is intended for and uniquely associated with said end, at least some of the preferably spatially fixed busbar thus being arranged between the connection housing and an inner wall of the power plug housing.

In an embodiment of this kind, it is therefore conceivable, for example instead of the power plug housing being arranged on a mounting surface of the connection housing, for said power plug housing to engage, by means of at least one power plug clip element arranged at the edge, into fastening points of the connection housing intended therefor.

According to at least one embodiment, the connection housing comprises at least one electrically conductive sliding contact element, said sliding contact element being electrically conductively connected firstly to an electrical circuit board of the connection housing and secondly to the busbar by means of sliding contact.

In particular, the sliding contact element may be in the form of a flexural spring. In addition, each sliding contact element may also have two or more bends, by means of which electrically conductive contact with a line of the busbar is established in the above manner.

By means of the bent portion, the presence of which is given by way of example, and the preferably acute angle thereof in relation to the line of the busbar, it is therefore made possible for the base element to be installed and mounted on the connection housing and on the circuit board under pressure, i.e. by the squeezing of the spring, such that permanent mechanical and preferably electrical contact is established between the sliding contact element and the busbar and/or the tapping device.

According to at least one embodiment, the sliding contact element is formed in one piece. This may mean that the sliding contact element is formed as a single, continuous element, for example formed of an electrically conductive metal. The sliding contact element may therefore be free of connection grooves and/or connection screws. In particular, the sliding contact element may be formed from a single metal piece in a single manufacturing process.

According to at least one embodiment, the control circuit boards are each designed and intended to drive at least one electric motor and/or to control said electric motor in a closed- loop and/or open-loop manner.

A circuit board (also referred to as a printed circuit board or PCB) is a support for electronic components. It is used for mechanical fastening and electrical connection. Practically every piece of electronic equipment contains one or more circuit boards.

Circuit boards consist of electrically insulating material having conductive connections (conductor tracks) adhered thereto. Fiber-reinforced plastic is typically used as the insulating material; laminated paper is used in cheaper equipment. The conductor tracks are in most cases etched from a thin layer of copper, typically 35 μm or 70 μm. The components are soldered onto pads or into lands. Said components are thus, at the same time, electrically connected to and mechanically held on these footprints. Larger components may also be fastened to the circuit board by means of cable ties, adhesive or screwing.

According to at least one embodiment, the control circuit boards each have a voltage pick-up of at least 16 volts and at most 56 volts, preferably at least 24 volts and at most 48 volts. The control circuit boards are preferably also designed and intended for this voltage range only. For example, the connection housing comprises an overcurrent protection circuit which ensures that the motor is protected from higher voltages. Alternatively or additionally, a motor of this kind which cannot be operated above the maximum voltage, for instance because the motor would burn out, may also be installed.

For example, the busbar comprises a 24 V line and a 48 V line, a GND line as an earth connection being arranged for each of the two lines. In this example, the busbar may comprise a total of four lines that are each arranged in parallel with one another.

It is conceivable for one of the two lines (24 V or 48 V) to be used to supply the motor or the control circuit boards with voltage, while the other line is used, by means of through plated holes, in the base support as a terminal energy supply for the power plug housing and a useful object connected thereto (e.g. a robot).

For example, the electric motor is a motor that drives the entire connection apparatus along the busbar by means of a drive pinion. The drive pinion may be mechanically operatively connected to a meshing rack. The meshing rack may extend in parallel with the busbar. The drive pinion may thus be part of the connection apparatus.

According to at least one embodiment, the sliding contact elements are formed by a first number of first contact elements for supplying power at at least one first voltage of one of the motor controller circuit boards, and by a second number of contact elements for supplying power at at least one second voltage of another motor controller circuit board, at least two contact element groups thus being formed. The individual contact elements in each group are arranged one after the other in a direction of travel of the connection housing, and each group separately supplies a motor controller circuit board uniquely assigned thereto with electrical power, in particular contact elements being formed as an earth connection (GND terminal) between the contact elements and the contact elements in a direction perpendicular to the direction of travel.

According to at least one embodiment, the current tapping apparatus comprises at least one, preferably exactly one, further sliding contact element, it being possible to supply at least one of the motor controller circuit boards with electrical power by means of said further sliding contact element.

According to at least one embodiment, the further sliding contact element is arranged be. tween two of the sliding contact elements of the contact elements in the direction of travel.

According to at least one embodiment, the contact elements of the first group are 48 V contact terminals, and the contact elements of the second group are 24 V contact terminals.

For example, the further sliding contact element is electrically conductively connected to one of the two control circuit boards. In particular, the further sliding contact element is used to enlarge a contact surface for one or both of the circuit boards. It is thus possible to supply current to one or both motors in an improved manner.

According to at least one embodiment, the further sliding contact element is designed as a 48-volt or 24-volt voltage pick-up and/or is electrically conductively connected to a 48 V or 24 V voltage pick-up of one of the control circuit boards.

According to at least one embodiment, the two control circuit boards are arranged one above the other, i.e. stacked, in a direction perpendicular to the direction of travel.

Furthermore, the present invention relates to a tapping apparatus system for transmitting electrical energy from a, preferably spatially fixed, busbar to a tapping apparatus which can be moved along the busbar or is also spatially fixed, at least two tapping apparatuses according to at least one of the above-claimed embodiments being arranged one after the other on a connection apparatus along the busbar.

In principle, the following, non-exhaustive list of materials may be used as materials for the connection housing and/or the combi clip.

| Material group | Modification | SHORE D |
|---|---|---|
| ABS | | 75-93 |
| | ABS + 30 M % GF | 62-68 |
| | ABS/TPE | 46 |
| | ABS/TPU | 58-68 |
| ASA | | 75 |
| ETFE | | 60-78 |
| EVA | | 17-45 |
| PA 11 | PA 11 + 23 M % GF | 70 |
| PA 12 | PA 12 (normal humidity) | 75-78 |
| | PA 12 + 30 M % GF (normal | 75 |
| PA 612 | | 73 |
| PA 6 | PA 6 (normal humidity) | 52-77 |
| | PA 6 + 30 M % GF | 48-80 |
| | PA 6 + 30 M.-% GF (dry) | 84 |

-continued

| Material group | Modification | SHORE D |
|---|---|---|
| PA 66 | PA 66 + 30 M % GF | 77-82 |
| | PA 66 + 30 M % GB | 81 |
| | PA 66 + 30 M % MX | 75-82 |
| PAEK | | 86-90 |
| | PAEK + 30 M % GF | 90 |
| PBI | | 99 |
| PBT | | 79-86 |
| | PBT + 30 M % GF | 53-85 |
| | PBT + 30 M % GX | 54 |
| PC | | 51-85 |
| | PC + 30 M % GF | 65-72 |
| | PC + 30 M % GX | 70 |
| PCTFE | | 76-80 |
| PE-HD | | 56-69 |
| PE-LD | | 39-83 |
| PE-LLD | | 38-60 |
| PE-MD | | 45-60 |
| PE-UHMW | | 60-65 |
| PEEK | | 83-88 |
| PEI | | 88-90 |
| PEK | | 87 |
| | PEK + 30 M % GF | 90 |
| PET | PET + 30 M % GF | 63-65 |
| PMMA | | 52-85 |
| | PMMA + 30 M % GF | 55 |
| POM | | 52-83 |
| pp | | 59-77 |
| | PP + 30 M % GF | 62-80 |
| | PP + 30 M % CD | 74-75 |
| | PP + 30 M % MF | 60-74 |
| | PP + 30 M % P | 65 |
| | PP + 30 M % CaC03 | 55-70 |
| | PP/EPDM | 40 |
| PS | | 78-80 |
| PTFE | | 50-90 |
| PUR | | 20-84 |
| PVC-U | | 74-94 |
| | PVC-U/NBR | 58-74 |
| PVC-P | | 42-77 |
| PVC-C | | 82 |
| PVDF | | 46-79 |
| SAN | | 45-85 |
| SMMA | | 72-82 |
| TPC | | 28-82 |
| TPE | | 48-78 |
| | TPE/PTFE | 56 |
| TPE-E | TPE-E + 30 M % GF | 55 |
| TPO | | 16-70 |
| TPS | | 60 |
| TPU | TPU + 30 M % GF | 74-80 |
| TPV | | 40-51 | where:
GF: glass fibres
GB: glass spheres
MF: mineral fibres
MX: unspecified mineral filling
GX: unspecified glass filling
CD: carbon powder
P: unspecified filling powder According to at least one embodiment, a material Shore D hardness value of the combi clip is greater than a material Shore D hardness value of the connection housing by at least two, preferably at least four, hardness values. The two components may be formed of the same basic material, into which plasticisers or hardeners are mixed. Plasticisers and hardeners of this kind can also be found in the table above.

This not only makes it easier to snap the combi clip onto the connection housing, but also guarantees stable guiding of the combi clip along the busbar.

For example, the combi clip is formed of ABS and the connection housing is formed of PA6, as can be seen in the table above.

However, it is also possible for the combi clip and the connection housing to be formed of the same material. The material may be PC or ABS.

A plurality of additional bodies, in particular substantially spherical bodies, such as glass microspheres, may be incorporated into the combi clip and/or the connection housing (or at least into a lower layer thereof) at least in portions. In this way, the mechanical load-bearing capacity is increased, and the coefficient of friction, on a guide for the connection housing, is also considerably reduced.

It is thus possible for the surface structure of the material to be formed of a plurality of spherical elements. Said elements, in particular spherical elements, are advantageously made of a material that is selected from a group of materials. Said material contains glass or ceramics spheres and the like, though preferably unipolar fillers.

Said additional bodies, for example spherical bodies, advantageously each have cross sections or volumes that have a diameter of less than 1 mm, preferably less than 0.1 mm, and particularly preferably less than 0.01 mm.

A percentage by weight of said spherical bodies is advantageously more than 5%, preferably more than 10%.and particularly preferably more than 20% in relation to the overall material.

Substantially spherical bodies, e.g. elliptical bodies, may also be provided instead of spherical bodies.

As seen in the accompanying Figures, FIG. 1A is a schematic perspective view of an embodiment of a tapping apparatus 100 according to the invention for transmitting electrical energy from a preferably spatially fixed bus-bar 1 to a tapping device 2 which can be moved along the busbar 1 or is also spatially fixed.

From FIG. 1A it can be seen that the tapping apparatus 100 first comprises a connection housing 10, the connection housing 10, together with a busbar 1, being mechanically connected to a tapping device 2.

However, the tapping device 2 is only shown as dashed lines in FIG. 1 such that the various plug elements are not concealed by the tapping device 2.

Indeed, as shown in FIG. 18, the tapping apparatus 100 preferably comprises a base support 10A, on which two control circuit boards 100A are mechanically rigidly, though preferably detachably, mounted. The base support 10A may be a DI/DO circuit board.

Figure 1B:
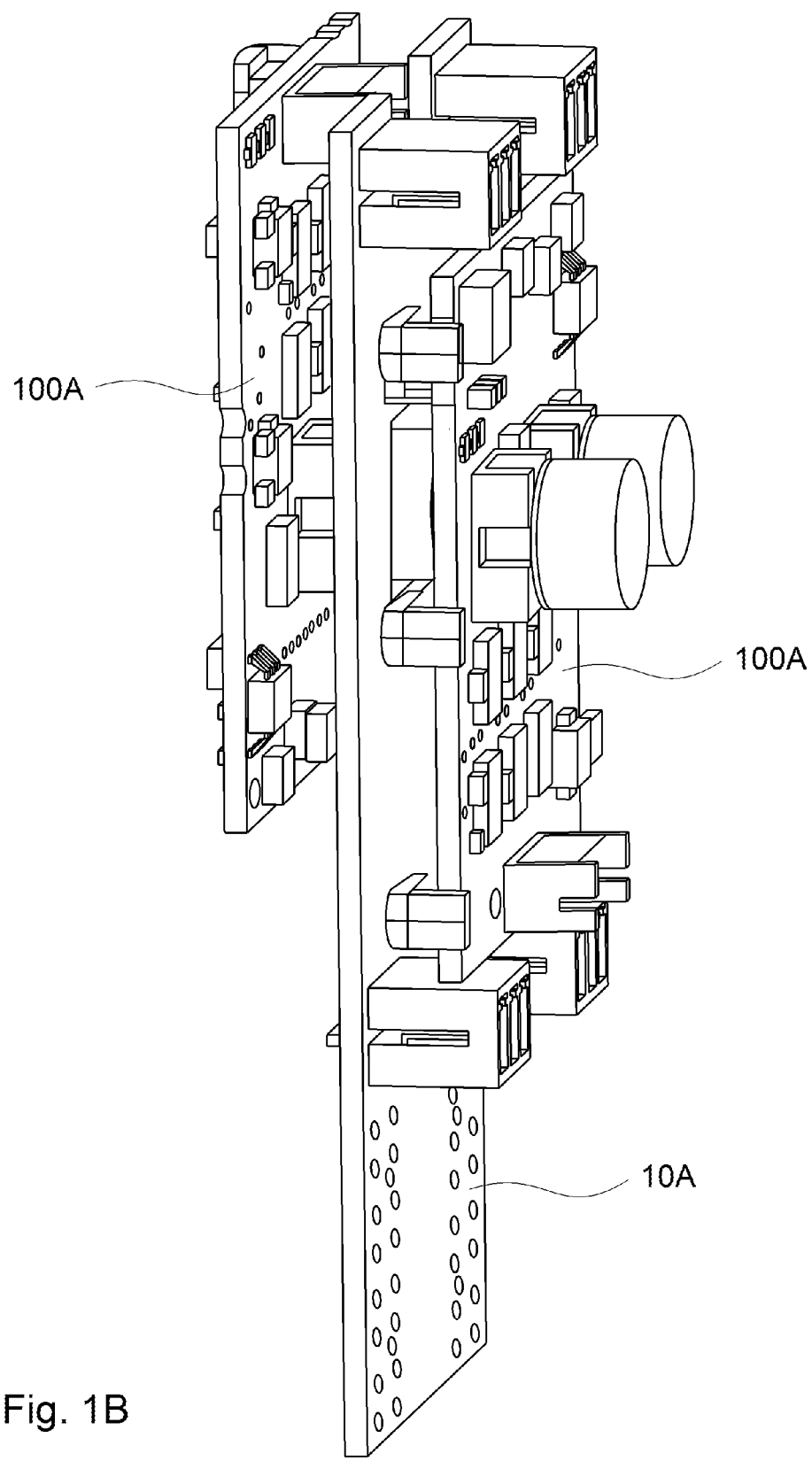

As shown in both FIG. 1A and FIG. 1B, the base support 10A therefore comprises two DI plugs and two DO plugs. The base sheet 1OA may additionally comprise two motor plugs. Said motor plugs may also be integrated into the control circuit boards 100A. For example, each control circuit board 100A comprises a motor plug.

In addition, light guides 17 can be seen in FIG. 1A, which are means for visually inspecting the functioning and state of the individual components of the control circuit boards 100A and/or of the base support 10A from the outside.

In this respect, the views in FIG. 1A and 18 differ merely in that, for reasons of simplification, neither the tapping apparatus 2 nor the connection housing 10 is shown such that the control circuit boards 100A, preferably arranged one above the other, and the base support 10A, arranged between the two control circuit boards 100A, are freely visible.

Figure 1C:
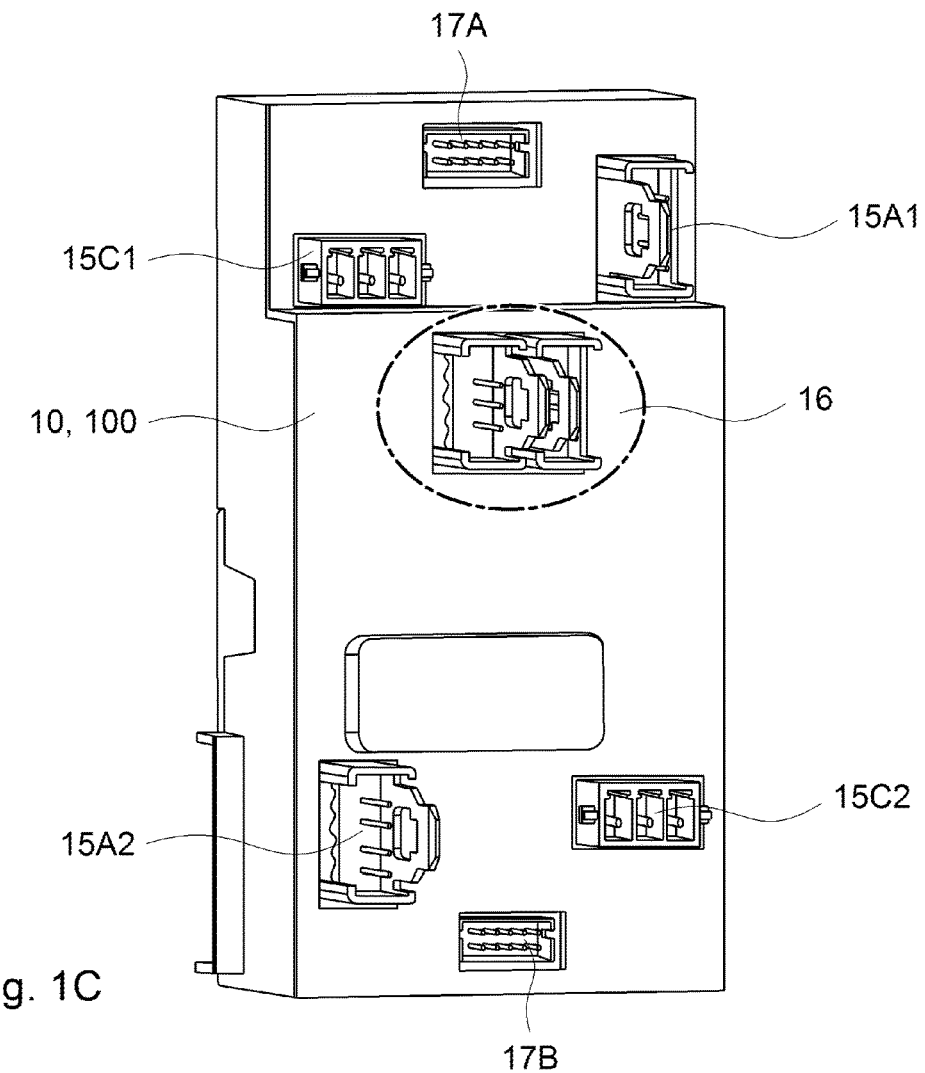

The tapping apparatus 100 shown in FIG. 1A to 18 can also be seen in FIG. 1C, the connection housing 10 being shown completely closed as far as the plug openings for the plugs 1SA to 178.

Plugs 15A1 and 15A2, 011 and 012 and plugs 15C1 and 15C2 as DO plugs can be seen. The plugs 17A and 178 are each plugs for motors that are to be connected. The plug 16 is a CAN/DAISY plug for connecting a CAN/DAISY bus/terminal.

Figure 1D:
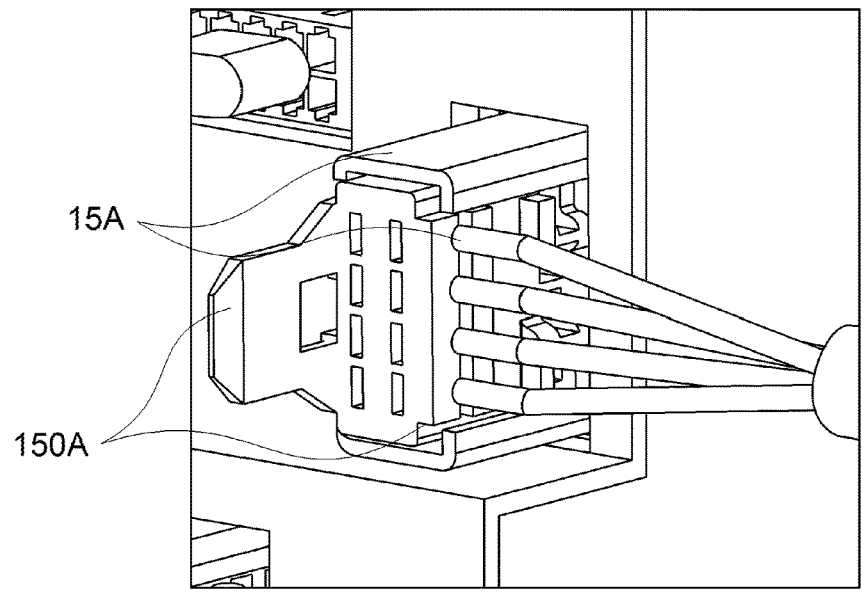

FIG. 1D is a schematic perspective, enlarged view of the plug 15A (for example, a DI plug) showing that the plug 15A shown in this figure comprises a lock mechanism 150A, through which the cable connections can be inserted into the plug 15A in particular from the side.

Figure 2A:
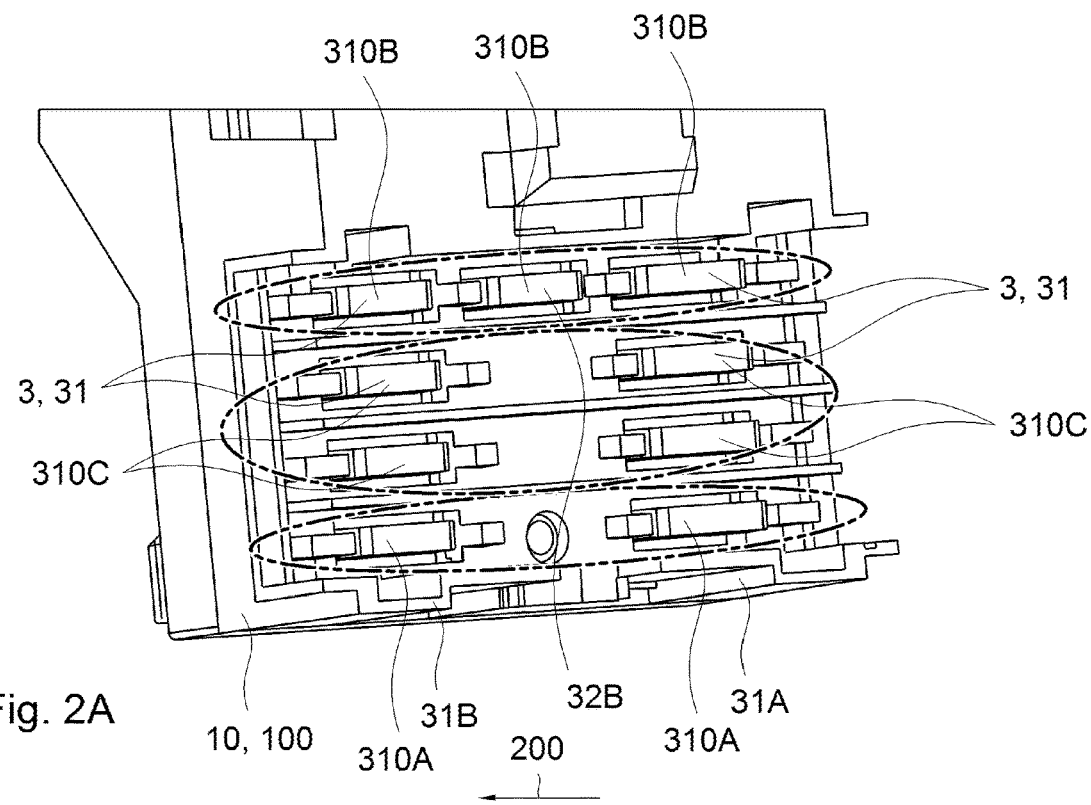
FIG. 2A and 2B are various perspective views of an embodiment of a current tapping apparatus or tapping apparatus 100 described herein, and of an embodiment of a herein described combi clip of the tapping apparatus.
Figure 2B:
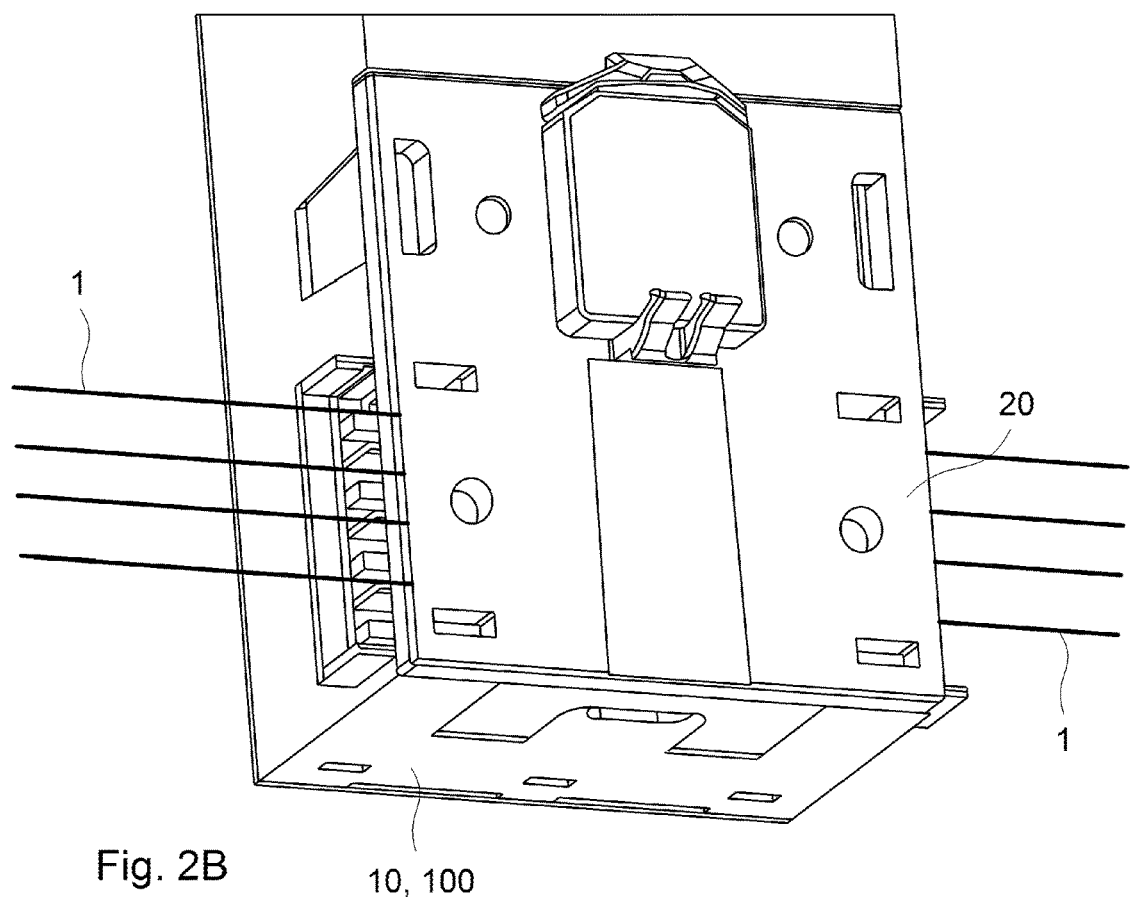

FIG. 2A is a schematic perspective detail of the herein described tapping apparatus 100 once again, although the current tapping apparatus 3 according to the invention is now shown, which comprises sliding contact elements 31 for collecting electrical energy from the busbar 1, the current tapping apparatus 3 being rigidly connected to the connection housing 10.

Furthermore, the sliding contact elements 31 are divided into a total of three sliding contact groups 310A, 3108 and 310C.

The sliding contact group 310A taps 24 V, the sliding contact group 3108 taps 48 V, and the sliding contact group 310C is the GND earth connection. Here it can be seen that a further sliding contact element 328 is also a 48 V sliding contact for enlarging the contact surface so that, on account of the higher power requirement, two motors can be sufficiently supplied with current at the same time.

In addition, all the sliding contact groups (48 V, GND, 24 V) are bridged on the base support 10A.

FIG. 28 is a schematic rear view of the tapping apparatus 100 shown interalia in FIG. 1C. As already indicated in FIG. 1C, a combi clip 20 can be seen, which is clipped onto the outer periphery of the connection housing 10 at the rear and from the outside by means of clip elements which are present, and therefore the sliding contact elements 31 are located in a thus formed cavity such that the busbar 1 is laid between the combi clip 20 and the sliding contact elements 31.

Figure 3:
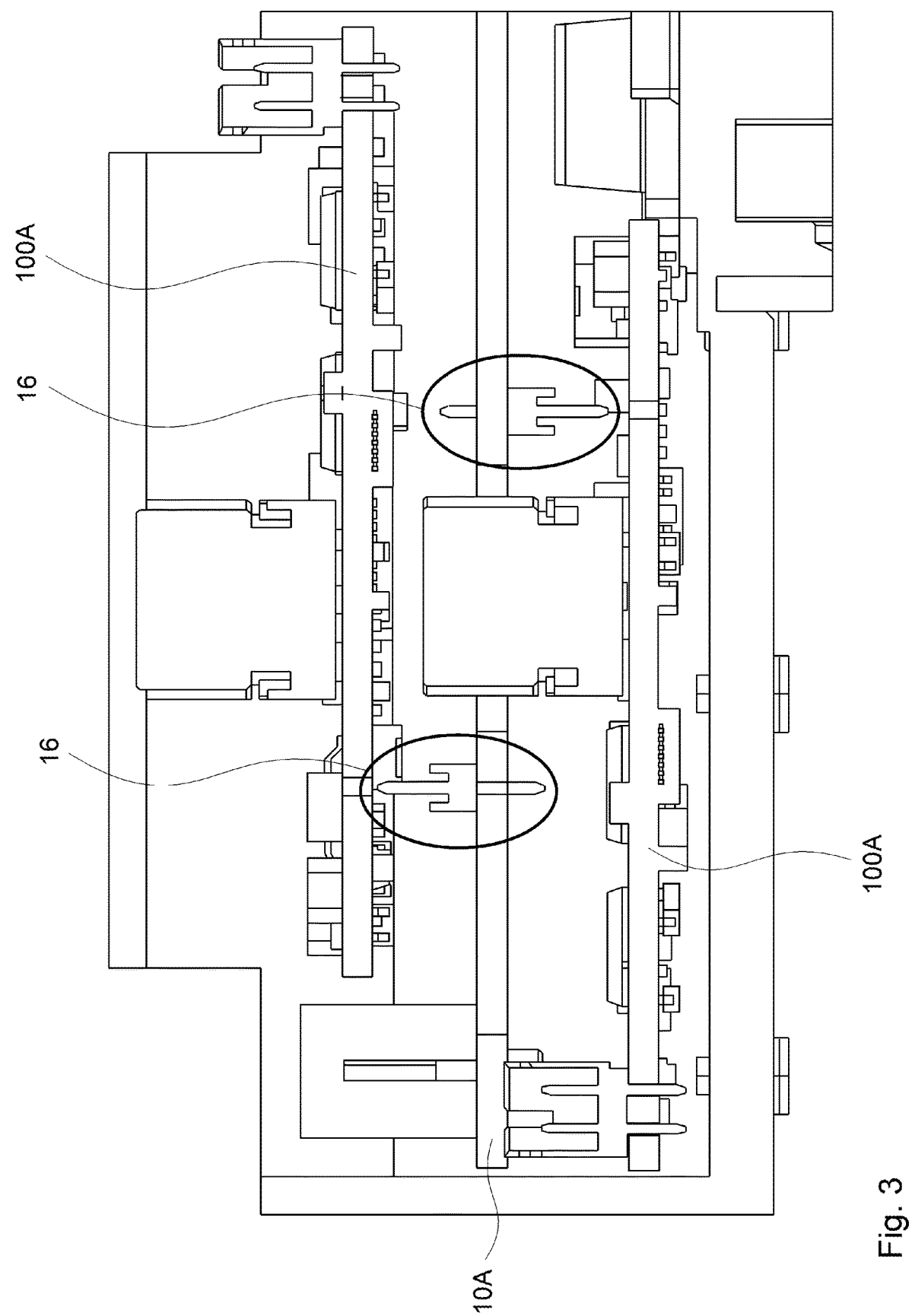
FIG. 3 is a schematic perspective sectional view through the tapping apparatus 100 described herein.
Figure 4:
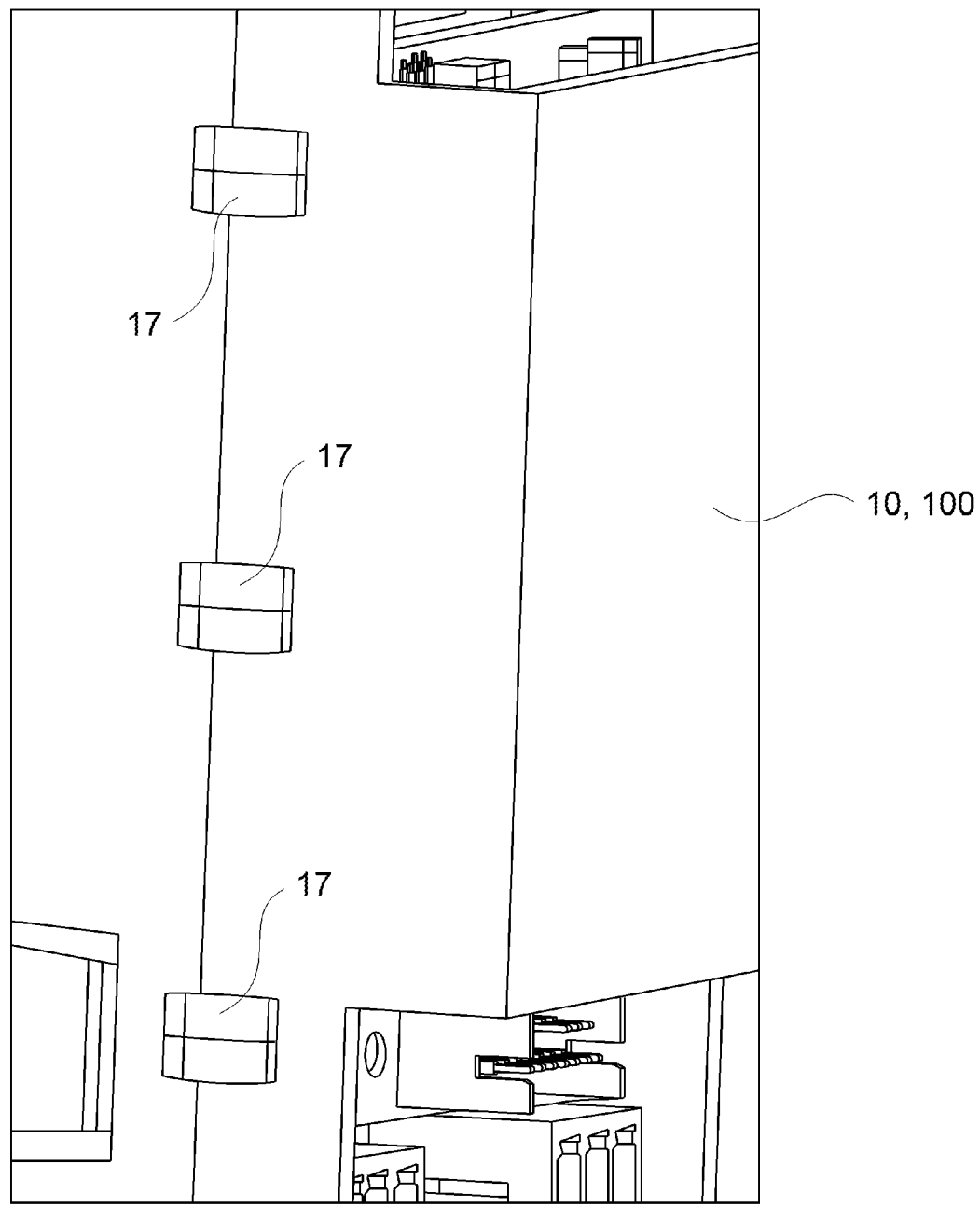
FIG. 4 is a schematic perspective view of light-guiding elements of the tapping apparatus 100.

FIG. 3 is a schematic sectional view of the herein described tapping apparatus 100 according to preceding FIG. 1A to 28, it being possible to see that the base support 10A is fastened to a lower control circuit board 100A by means of a circuit board fastener 16.

The same also applies to the upper control circuit board 100A, which is fastened to the base support 10A by means of a further circuit board fastener 16.The circuit board fasteners may be in the form of pin headers. Said pin headers may be soldered in corresponding holes in the control circuit boards 100A.

In particular, it can thus be ensured that the control circuit boards 100A are able to withstand at least 40 N tensile and lifting forces, the tapping device 2 being unplugged and plugged in at least ten times without damage to the material.

The light guide 17 already shown in FIG. 1A can be seen in FIG. 4, again in a schematic perspective view.

Figure 5A:
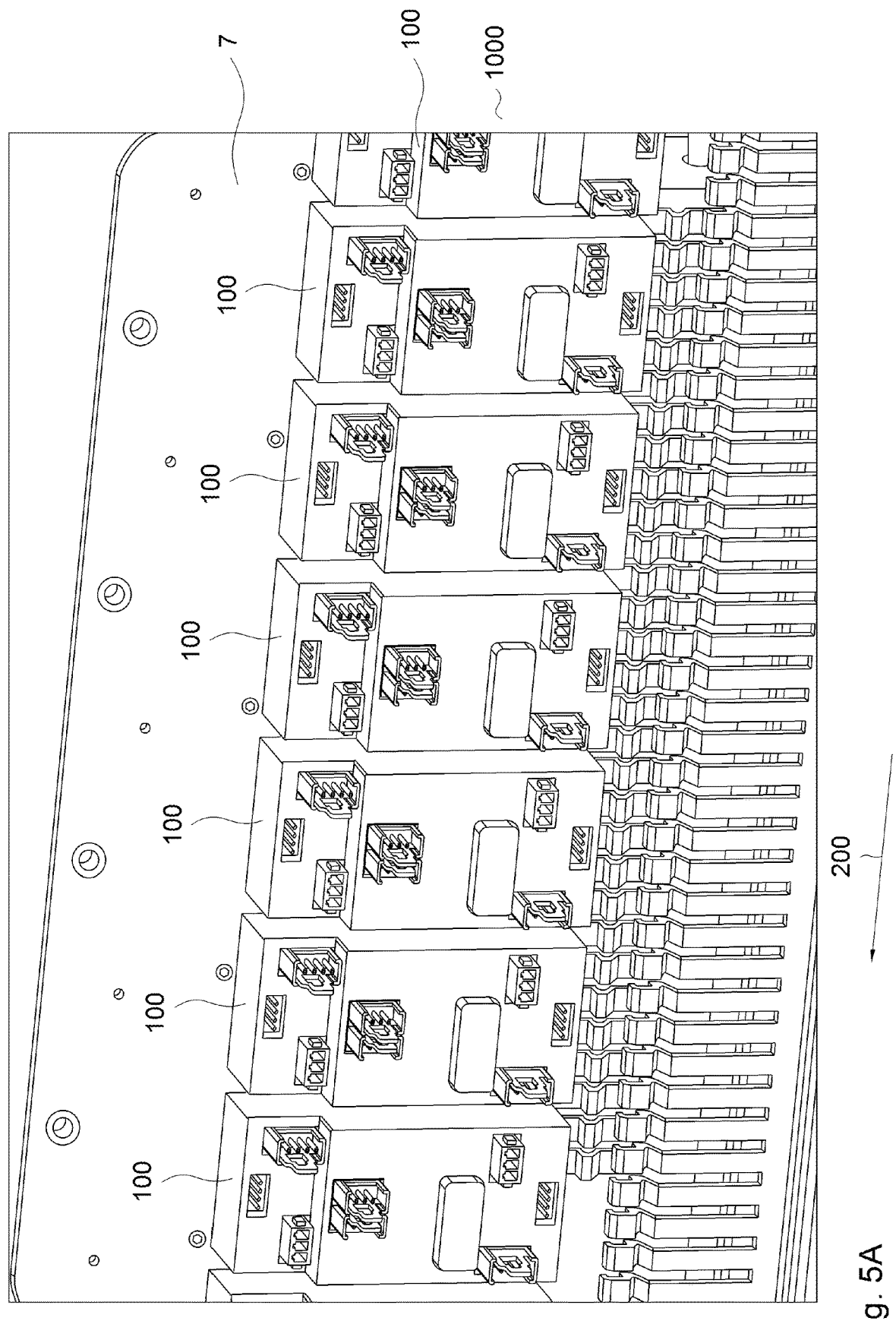
FIG. 5A and 5B show tapping apparatuses 100 connected in series, such that an embodiment of a tapping apparatus system 1000 described herein is shown in each of FIG. 5A and 5B in a schematic perspective view.

FIG. 5A shows an embodiment of a tapping apparatus system 1000 described herein, the individual tapping apparatuses 100, as shown in the above-mentioned figures, being arranged so as to be connected in series, though at least one after the other, by means of a connection apparatus 7, which is in the form of a connection sheet in the present case.

Figure 5B:
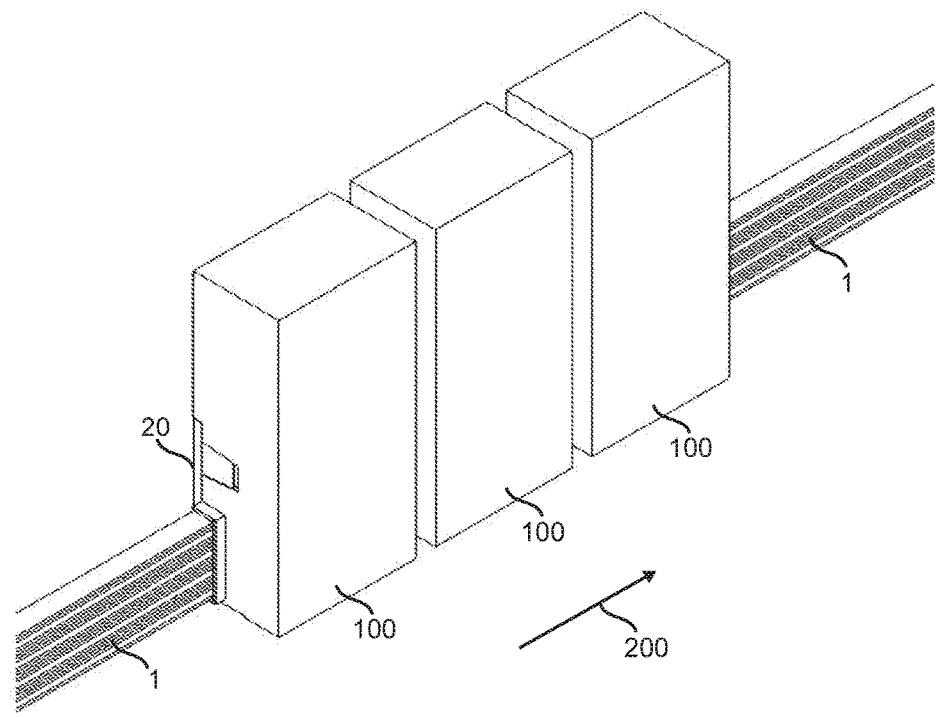

FIG. 5B is a schematic perspective view of the series arrangement of the individual tapping apparatuses 100 once again, for example in a direction of travel 200, it being possible in this case to once again see the combi clip 20 of each tapping apparatus 100.

The connection housing 1O may be in the shape of a cuboid, having edge lengths of a width of the connection housing 1o of from at least 40 mm to at most 70 mm, of a height of at least 80 mm and at most 120 mm. and of a depth of at least 20 mm and at most 50 mm.

Figure 6:
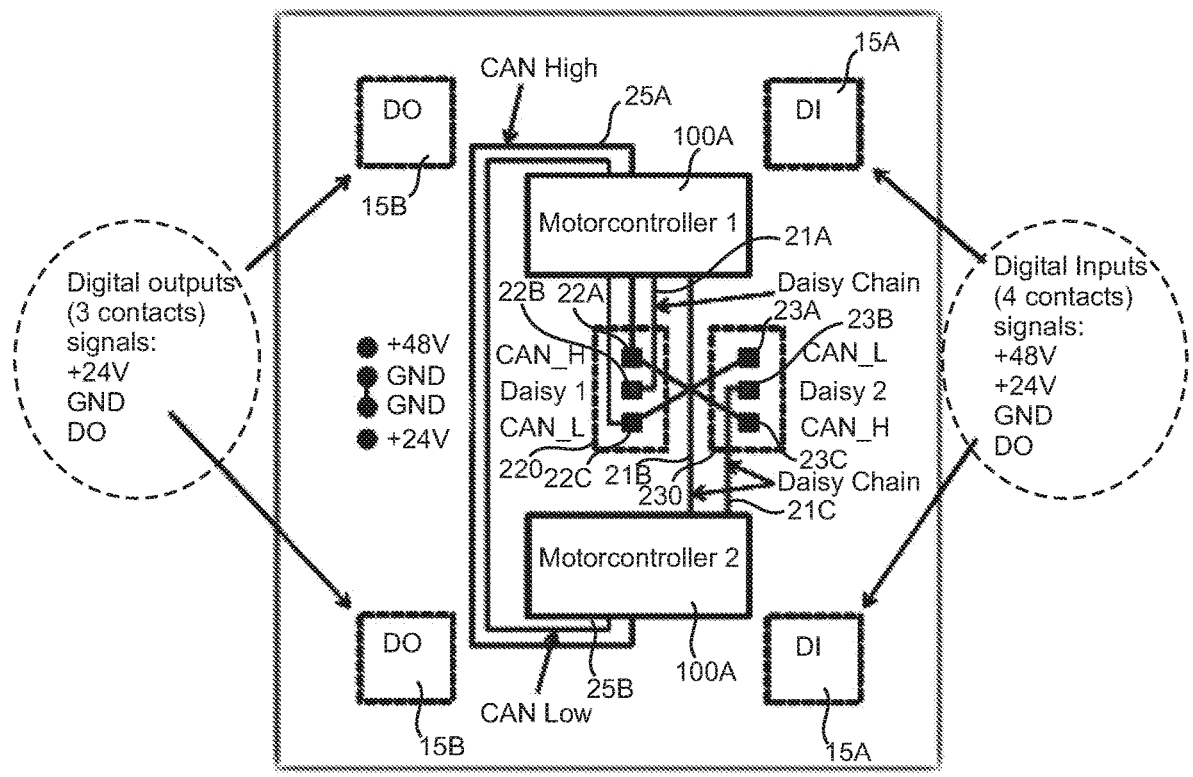
FIG. 6 is a schematic circuit diagram of two control circuit boards 100A of a tapping apparatus 100 described herein.

FIG. 6 shows a structure in principle and the circuitry of the individual control circuit boards 100A, in particular of the individual controllers of the control circuit boards 100A.

It can be seen that the individual controllers are connected in series by means of daisy chains 21A, 218, 21C. In particular, it can also be seen that a terminal 22A (CAN H terminal), a terminal 228 (Daisy 1 terminal) and a terminal 22C (CAN L terminal) are present, and a terminal system 220 therefore framed by dashed lines is formed.

Said terminal system 220 is associated with one of the control circuit boards 100A and/or arranged thereon, while a further terminal system 230 is associated with the other control circuit board 100A. The terminal system 230 structured in the same way as the terminal system 220 and is similarly electrically conductively connected to the other control circuit board 100A only. In this respect, the terminal system 230 also comprises a plug 23A (CAN L terminal), a plug 238 (Daisy 2 terminal) and a plug 23C (CAN H terminal).

The respective plugs 15A, which are designed as the E plugs in the present embodiment, can also be seen. The plugs 15B, which are designed as the upper plugs, can also be seen.

In addition, electrical transmission and/or information connections 25A (CAN High connections) and 256 (CAN low connection) are shown.

The plugs 158 are therefore digital output plugs which, for example, each comprise three contacts to which a voltage of 24 V is or can be applied.

The plugs 15A are DI plugs to which 24 V and/or 48 V can be selectively applied.

Figure 7:
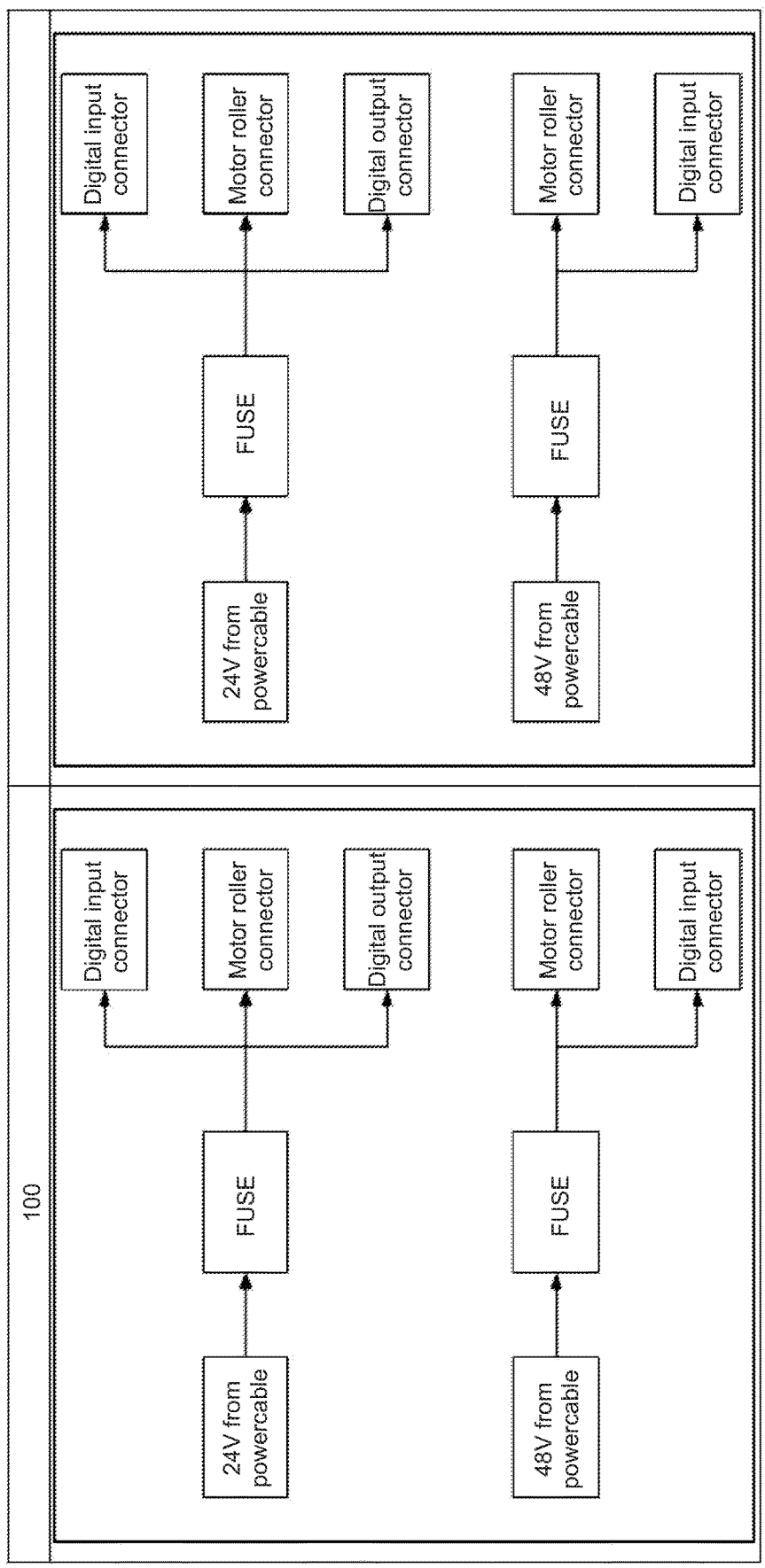
FIG. 7 is a schematic view of information and circuit connections among a 24 V terminal of the busbar 1 and a 48 V terminal of the busbar 1.

FIG. 7 shows basic information flow diagrams which show a voltage pick-up from a 24 V line of the busbar 1 and from a 48 V line of the busbar 1. In the case of the 24 V voltage pick-up, both the DI plugs and the DO plugs are line-connected to the 24 V pick-up, while only a DI plug is connected to the 48 V pick-up.

In any case, the individual tapping apparatuses 100 are preferably interconnected in an identical manner.

The invention is not limited to the description of the embodiments. On the contrary, the invention covers each novel feature and any combination of features, also including in particular any combination of the claims, even if this feature or this combination itself is not explicitly mentioned in the claims or the embodiments.

LIST OF REFERENCE SIGNS 1 busbar
2 tapping device
3 current tapping apparatus
7 connection apparatus
10 connection housing
10A base support
DI 1 plug
DI 2 plug
15A plug
15A1 plug
15A2 plug
15B plug
15C plug
15C1 plug
15C2 plug
15D plug
16 circuit board fastener
17 light guide
17A plug
17B plug
20 comb I clip
21A daisy chain
21B daisy chain
21C daisy chain
22A CANH terminal
22B Daisy 1 terminal
22C CANL terminal
23A CANL terminal
23B Daisy 2 terminal
25A transmission and/or information connections (CAN High connection)
25B transmission and/or information connections (CAN Low connection)
31 sliding contact elements
31A first number of contact elements
31B second number of contact elements
32B further sliding contact element
71 connection sheet
100 tapping apparatus
100A control circuit board
150A lock mechanism
200 direction of travel
220 terminal system
230 terminal system
310A sliding contact group
310B sliding contact group
310C sliding contact group
1000 tapping apparatus system

I claim:

1. 1A tapping apparatus (100) for transmitting electrical energy from a fixed busbar (1) to a tapping device (2) which can be moved along the busbar (1) or is also spatially fixed, said tapping apparatus comprising:
at least one connection housing (10), the busbar (1) being mechanically connected or connectable to the tapping device (2) by means of the connection housing (10),
a current tapping apparatus (3) which comprises sliding contact elements (31) for collecting electrical energy from the busbar (1), the current tapping apparatus (3) being mechanically rigidly connected to the connection housing (10), and
characterized in that the connection housing (10) comprises at least one base support (10A), on which at least two control circuit boards (100A) are mounted on either side thereof and arranged one above the other, stacked in a direction perpendicular to a direction of travel (220).

2. The tapping apparatus (100) according to claim 1, wherein the at least one base support (10A) consists of the at least two control circuit boards (100A).

3. The tapping apparatus (100) according to claim 1, characterized in that the control circuit boards (100A) are operably connected to at least one electric motor and control said electric motor in a manner selected from the manners consisting of a closed-loop and open-loop manner.

4. The tapping apparatus (100) according to claim 1, characterized in that the sliding contact elements (31) are formed by a first number of first contact elements (310A) for supplying power at at least one first voltage of one of the control circuit boards (100A), and by a second number of contact elements (310B) for supplying power at least one second voltage of another control circuit board (100A), at least two contact element groups thus being formed, the individual contact elements (310A, 310B) in each group being arranged one after the other in a direction of travel (220) of the connection housing (10), and each group separately supplying a control circuit board (100A) uniquely assigned thereto with electrical power, and contact elements (310C) being formed as an earth connection (GND terminal) between the contact elements (310A) and the contact elements (310B) in a direction perpendicular to the direction of travel (220).

5. The tapping apparatus (100) according to preceding claim 4, characterized in that the current tapping apparatus (3) comprises at least one further sliding contact element (32A), it being possible to supply at least one of the control circuit boards (100A) with electrical power by means of said further sliding contact element (32A).

6. The tapping apparatus (100) according to preceding claim 5, characterized in that a further sliding contact element (31B) is arranged between two of the sliding contact elements (31) of the contact elements (310A) in the direction of travel.

7. The tapping apparatus (100) according to preceding claim 4, characterized in that the contact elements (310B) are 48 V contact terminals, and the contact elements (310A) are 24 V contact terminals.

8. A tapping apparatus system (1000) for transmitting electrical energy from a spatially fixed, busbar (1) to a tapping device (2) which can be moved along the bus-bar (1) or is also spatially fixed, characterized in that at least two tapping apparatuses (100) are arranged one after the other on a connection apparatus (7) along the bus-bar (1).

9. The tapping apparatus system (1000) according to preceding claim 8, characterized in that the connection apparatus (7) is in the form of a connection sheet (71).

10. The tapping apparatus (100) according to claim 1, characterized in that the control circuit boards (100A) have at least one voltage pick-up of +24 V and at least one voltage pick-up of +48 V.

* * * * *